(12) United States Patent
Black

(10) Patent No.: US 6,794,769 B2
(45) Date of Patent: Sep. 21, 2004

(54) CURRENT MODE COUPLER HAVING A UNITARY CASING

(75) Inventor: Ricky C. Black, Huntsville, AL (US)

(73) Assignee: Sanmina-SCI Corporation, Huntsville, AL (US)

( * ) Notice: Subject to any disclaimer, the term of this patent is extended or adjusted under 35 U.S.C. 154(b) by 171 days.

(21) Appl. No.: 10/126,168

(22) Filed: Apr. 19, 2002

(65) Prior Publication Data

US 2002/0175797 A1 Nov. 28, 2002

Related U.S. Application Data

(60) Provisional application No. 60/287,771, filed on May 1, 2001, and provisional application No. 60/334,562, filed on Nov. 30, 2001.

(51) Int. Cl.[7] .............................................. H01F 27/42
(52) U.S. Cl. ........................ 307/104; 336/176; 361/601
(58) Field of Search ........................ 307/104; 336/176; 361/600, 601, 603, 331, 380

(56) References Cited

U.S. PATENT DOCUMENTS

| | | | |
|---|---|---|---|
| 5,241,219 A | * | 8/1993 | LeBaron et al. ............. 307/104 |
| 5,360,352 A | | 11/1994 | Rudy, Jr. et al. |
| 5,435,512 A | | 7/1995 | Rudy, Jr. et al. |
| 5,514,917 A | | 5/1996 | Rudy, Jr. et al. |
| 5,528,088 A | | 6/1996 | Gallusser et al. |
| 5,528,823 A | | 6/1996 | Rudy, Jr. et al. |
| 5,530,297 A | * | 6/1996 | Rudy et al. ................. 307/104 |
| 5,531,614 A | | 7/1996 | Gallusser et al. |
| 5,679,025 A | | 10/1997 | Barnes, Jr. et al. |
| 5,783,873 A | | 7/1998 | Dohan et al. |
| 6,041,152 A | | 3/2000 | Clark |
| 6,196,864 B1 | | 3/2001 | Huguenet |

* cited by examiner

Primary Examiner—Jessica Han
(74) Attorney, Agent, or Firm—Lanier Ford Shaver & Payne P.C.; Frank M. Caprio

(57) ABSTRACT

A current mode coupler includes a unitary casing, a stub cable connector, a circuit board, a magnetic structure, a wire core holder, an enclosing lid and an E-core situated in a cavity in the unitary casing and an I-core affixed to the enclosing lid. When the enclosing lid is in a closed position, the E-core and the I-core contact, forming a transformer. When electrical current is present in a data bus that is situated within the E-core/I-core arrangement, the coupler magnetically couples the current mode doublets on the data bus to the circuitry enclosed in the unitary casing. The current mode doublets sensed on the data bus is then converted to voltage mode doublets and transmitted to the stub interface. The current mode coupler also receives voltage mode doublets through the stub interface, converts the voltage mode doublets to current mode doublets, and transmits the current mode doublets via the E-core/I-core arrangement.

17 Claims, 23 Drawing Sheets

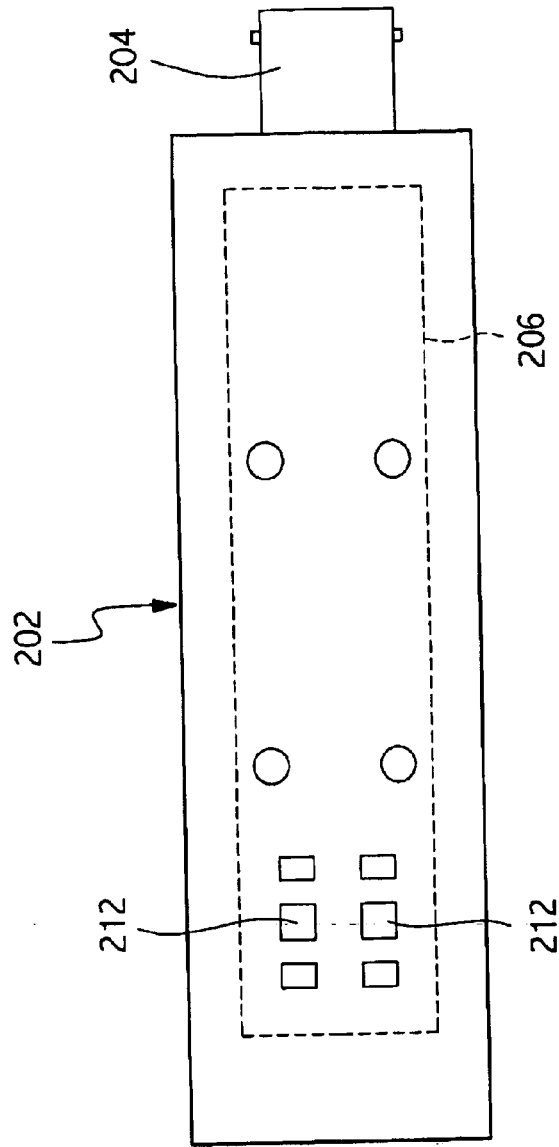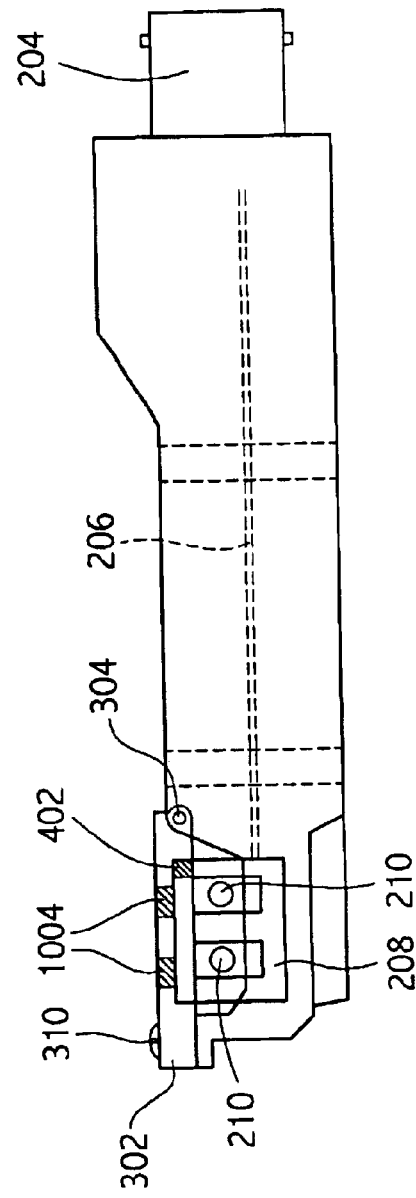
FIG. 2A
FIG. 2B

CURRENT MODE COUPLER HAVING A UNITARY CASING

CROSS REFERENCE TO RELATED APPLICATIONS

This application claims the benefit of priority under 35 U.S.C. § 119(e) of U.S. Provisional Application Ser. No. 60/287,771 entitled "Current Mode Coupler", filed on May 1, 2001, and U.S. Provisional Application Ser. No. 60/334,562 entitled "Current Mode Coupler with Retention Wire", filed on Nov. 30, 2001, the entireties of which are incorporated herein by reference.

BACKGROUND

1. Field

The present invention relates generally to the field of electrical connectors, and particularly, to a current mode coupler that connects to a current mode data bus.

2. Description of the Related Art

A data communication system on an airplane needs to facilitate data sharing between various subsystems, such as between a navigation subsystem and a flight control subsystem. Currently in use in the industry is a common data bus that connects each of the subsystems, thereby allowing communication between the connected subsystems. A common data bus implementation allows connection between the subsystems and alleviates the need for direct wiring between each subsystem. This solution is more practical in the avionics industry because it reduces the amount of wiring necessary to establish communication between the subsystems, thereby reducing the weight burden of the avionics communication system.

A current mode data bus is typically used in the avionics industry. A current mode data bus communication system utilizes a twisted pair cable to facilitate communication. Each subsystem is electrically connected to the data bus via current mode couplers that sense electrical current in the twisted pair cable.

Various subsystems interface to the current mode data bus without an invasive connection to the wire itself. The non-invasive interface is achieved by electrically connecting the subsystem to the data bus by use of inductive coupling. Inductive coupling is accomplished by including in the electrical connection a magnetic structure that allows for mutual inductance between the data bus cable and the magnetic structure. As long as the twisted pair cable is unshielded, the mutual inductance allows a subsystem to receive and transmit data from and to the data bus without physical connection to the cable itself.

Non-invasive coupling, accomplished by use of a current mode coupler employing mutual inductance, is suitable for several reasons. A communication system designed to allow subsystems to communicate on one data bus requires less wiring, thereby reducing the weight of such a system. The non-invasive nature of the current mode coupler proves to be more easily maintainable, allowing replacement of communication system connectors without undermining the integrity of the data bus by requiring physical connection to the cable wiring.

Current mode couplers currently in use have several disadvantages. Current mode couplers currently used employ an intricate alignment mechanism that is necessitated by the E-core/E-core (EE) structure. The faces of the legs of the E-cores used in an EE structure must be perfectly aligned to reduce signal losses. The minimal surface area available on the E-core faces requires that maximum contact occur between the E-cores; hence, precise alignment is requisite.

In addition, other couplers use separate inactive base sections that contain one set of E-cores and a separate active section that also contains an E-core and additional circuitry. This configuration requires a low impedance interface between the two sections of the coupler that can be in the form of spring fingers implemented in the upper and lower base attachment. This requirement causes additional weight, component count, and manufacturing cost.

Another disadvantage of conventional current mode couplers is its use of a separate base unit and upper housing. This results in unnecessary weight since the upper housing contains the active electronics, the lower housing (i.e., base unit) contains the inactive electronics, and an inductance equalizer must be established between the two. This configuration requires a low impedance interface between the two sections of the coupler that can be in the form of spring fingers implemented in the upper and lower base attachment. This requirement causes additional weight, component count, and manufacturing cost.

A further disadvantage of conventional current mode couplers is the use off-the-shelf transformers. Off-the-shelf transformers have significant failure modes and the use of the off-the-shelf transformers increases the cost of the current mode coupler.

The current mode coupler disclosed in U.S. Pat. No. 5,241,219 is a non-invasive coupler that creates a magnetic core structure that senses signals on a data bus cable. The patent generally discloses an intricate assembly that requires precise alignment of an upper and lower magnetic core using openings in a wire guide member to facilitate precise alignment for the creation of a workable inductor.

What is desired is a current mode coupler that weighs less, has a more reliable transformer and core design, and does not require sensitive alignment in order to perform. In addition, a receive-only coupler that only receives data from the current mode data bus is also desired.

SUMMARY

The present invention provides a current mode coupler apparatus and corresponding methods suitable for connecting one or more subsystems to a current mode data bus. For example, the current mode coupler disclosed herein is suitable for coupling subsystems typically found in an airplane to a current mode data bus. The present invention provides improvements over conventional connector designs. Specifically, the present invention includes an E-I core arrangement that overcomes the need for design intricacies prevalent in conventional current mode couplers. In addition, the present invention utilizes an inexpensive and more effective circuit board. The present invention eliminates the need for the use of off-the-shelf transformers that have multiple failure modes.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

One aspect of the present invention relates to a current mode coupler that receives voltage mode doublets, converts the voltage mode doublets into current mode doublets, and transmits the current mode doublets onto a data bus. Additionally, the current mode coupler receives current mode doublets from a data bus and converts the doublets to voltage mode doublets for transmission through a stub cable. The current mode coupler of the present invention includes a stub cable interface, a circuit board communicating with the data bus cable and the stub cable interface, and a data bus interface. The data bus interface includes bus transformers, a ferrite E-core, and a ferrite I-core that encompass the current mode data bus cable when an enclosing lid is in a closed position.

Another aspect of the present invention relates to a current mode coupler that interfaces to a current mode data bus where a ferrite E-core and a ferrite I-core are enclosed by a lid attached to a unitary casing by a hinge. When the enclosing lid is in a closed position, the I-core and the E-core form a magnetic structure that surrounds the data bus cable allowing the transmission and reception of current doublets from the data bus cable. The enclosing lid further includes a spring device located in proximity to the I-core. When the lid is in a closed position, the I-core face and the E-core face contact and the spring mechanism causes a pressurized contact.

A further aspect of the present invention is directed to a current mode coupler that interfaces to a current mode data bus where a ferrite E-core and a ferrite I-core are enclosed by a lid attached to a unitary casing by a sliding mechanism. The sliding mechanism allows for contact between the I-core and E-core faces when it is in the closed position. The lid includes a spring mechanism positioned proximate the I-core such that when the lid is in the closed position, the spring urges the faces of the ferrite cores together.

A yet another aspect of the present invention is directed to a current mode coupler that does not require alignment between the core faces. The use of an E-core/I-core transformer requires only the requisite contact between the E-core faces and the I-core face. No longer are there three E-core surfaces to align with three other E-core surfaces as is typically found in conventional current mode couplers.

A yet further aspect of the present invention is directed to a current mode coupler that is encased in a unitary casing. This eliminates the need for low impedance interconnects between the active and inactive sub-housings, thereby, eliminating weight, component count and manufacturing cost.

One aspect of the present invention is directed to a current mode coupler that includes an enclosing lid and a retention wire. When the enclosing lid is placed in a closed position, the retention wire functions to securely hold the enclosing lid in the closed position.

These and other embodiments of the present invention will also become readily apparent to those skilled in the art from the following detailed description of the embodiments having reference to the attached figures, the invention not being limited to any particular embodiment(s) disclosed.

BRIEF DESCRIPTION OF THE DRAWINGS

The elements of the drawings are not necessarily to scale, emphasis instead being placed upon clearly illustrating the principles of the invention. Throughout the drawings, like numerals are used for like and corresponding parts of the various drawings.

FIG. 2A is a plane view of one embodiment of a current mode coupler showing a hinge attaching an enclosing lid to a unitary casing.

FIG. 2B is a side elevation view of one embodiment of a current mode coupler showing a hinge attaching an enclosing lid to a unitary casing.

DETAILED DESCRIPTION

A current mode coupler of the present invention provides an interface to a current mode data bus for transceive and receive-only applications. The current mode coupler of the various embodiments of the present invention uses an E-I transformer core arrangement for the transmit and the receive functions. The current mode coupler includes a unitary casing with a lid configured to attach to the unitary casing. This allows the positioning of the I-core over the top of the data bus cable to secure the I-core in proper position with respect to the E-core.

Figure 1:
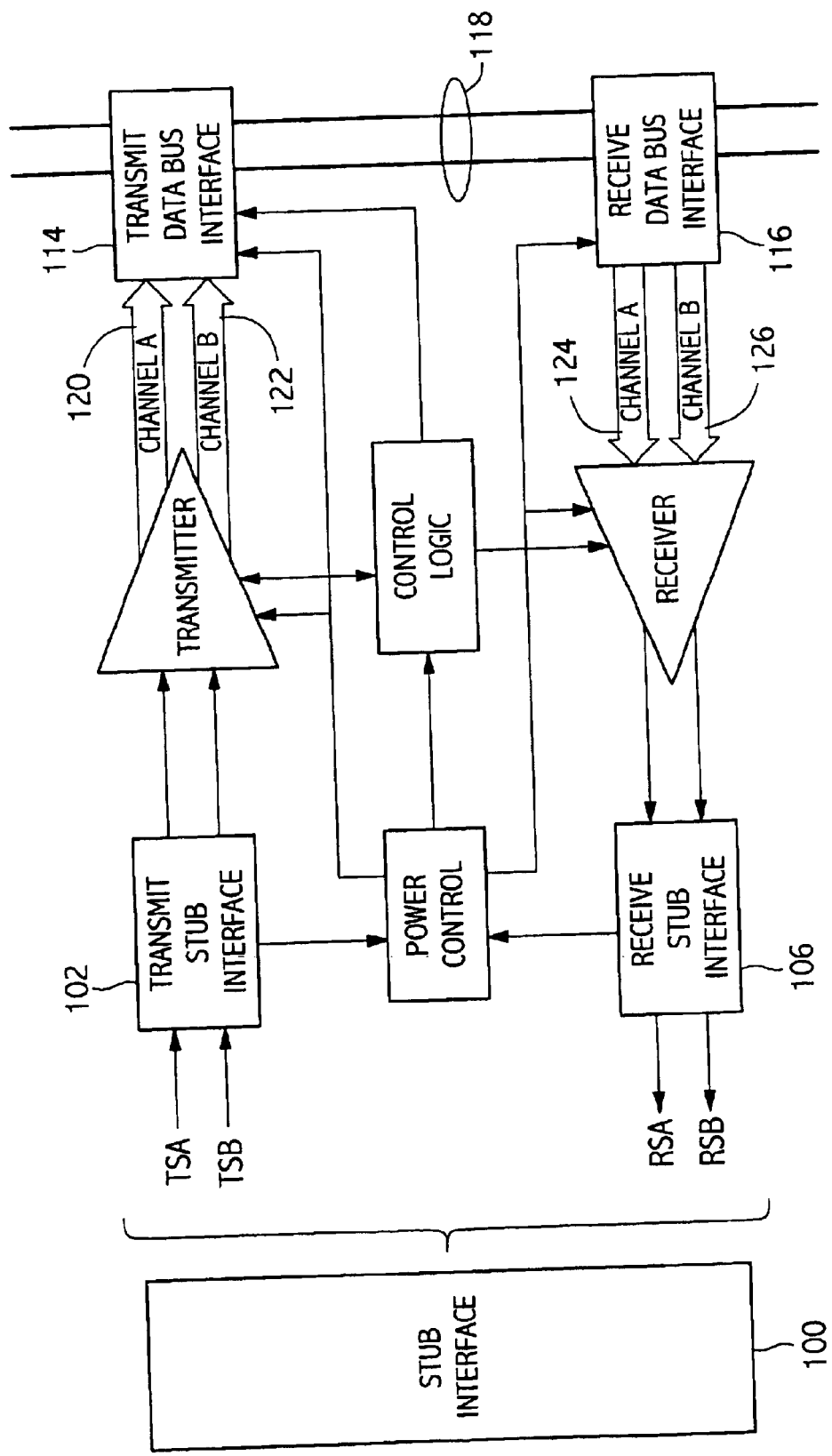
FIG. 1 is a block diagram depicting components of a current mode coupler, according to one embodiment of the present invention.

FIG. 1 is a block diagram depicting components of one embodiment of a current mode coupler of the present invention. A stub interface 100 functions as an interface thereby allowing the transference of data from a data bus 118 (or twisted pair cable) to a controller designed and configured to receive data in a format the data is transferred in.

The current mode coupler includes dual transmit channels 120 and 122 and dual receive channels 124 and 126. Each transmit and receive channel includes a bus driver and a transimpedance amplifier. The bus driver is responsible for doublet transmission onto data bus 118, while the impedance amplifier transfers bus doublets to stub interface 100. The current mode coupler of the present invention can also function in a receive-only mode or state when both transmit channels 120 and 122 are disabled or not present. Other embodiments of the current mode coupler of the present invention can include a different number of transmit and/or receive channels.

One embodiment of the current mode coupler of the present invention is now described with reference to FIGS. 2A and 2B. FIG. 2A and FIG. 2B illustrates a plane view and side elevation view, respectively, of the current mode coupler. FIG. 2A shows a current mode coupler having a unitary casing 202 having a connector at one end and a data bus interface housing at proximately the other end. The data bus interface housing houses a magnetic core, such as an E-core, and other components that are necessary to operably house the magnetic core in and/or about the data bus interface housing.

A communication component, such as a circuit board 206, is operably placed within unitary casing 202 and includes circuitry and components to facilitate communication between one or more coupled devices. As depicted, circuit board 206 is coupled to a connector, such as a stub connector 204, at one end and a magnetic core, such as an E-core 208, at the other end. E-core 208 is inductively interfaced to the data bus, for example, a cable 210 (FIG. 2B). E-core 208 is operably situated within the data bus interface housing of unitary casing 202, thus becoming a part of unitary casing 202. FIG. 2A depicts E-cores 212 in relation to stub connector 204. Circuit board 206 facilitates communication between, for example, stub connector 204 and an inductively interfaced cable 210.

Figure 3:
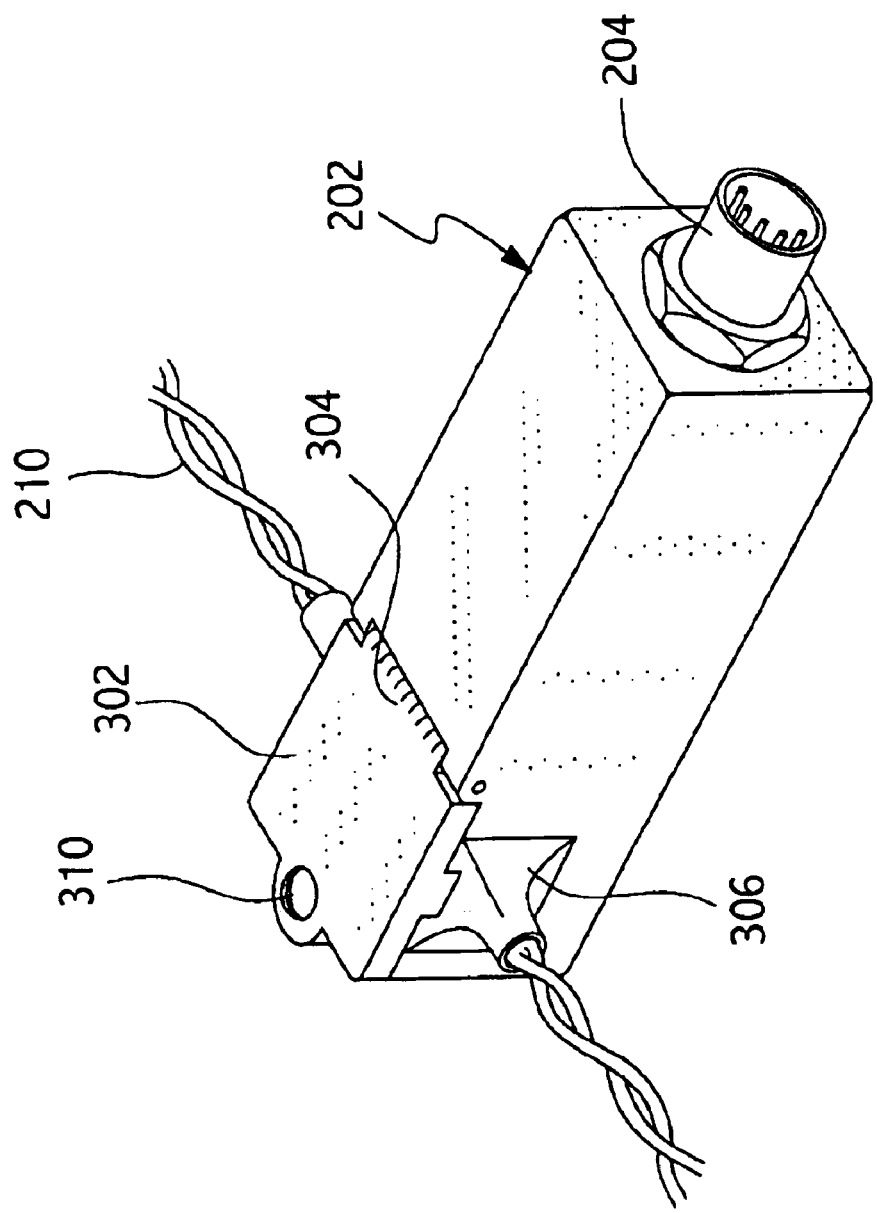
FIG. 3 is a perspective view of one embodiment of a current mode coupler having a hinged enclosing lid in a closed position.
Figure 4:
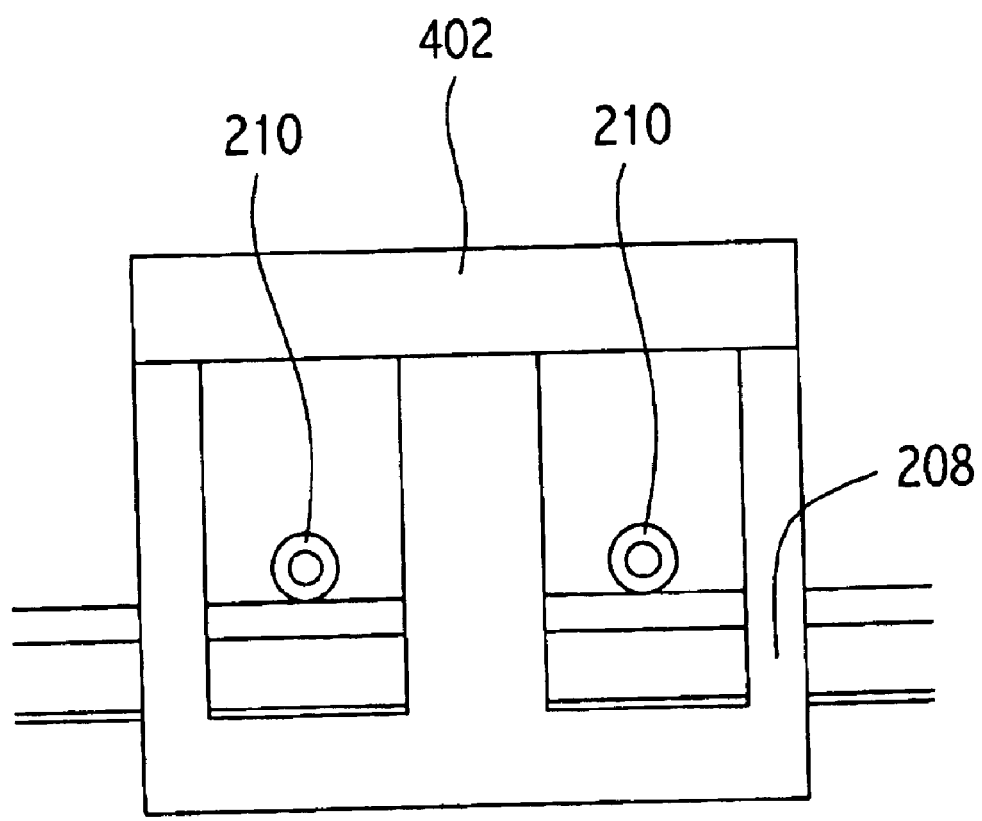
FIG. 4 is a partial cross-sectional view of one embodiment of the current mode coupler of FIG. 2A taken along line 4—4 to illustrate the E-core/I-core arrangement.

FIG. 3 depicts one embodiment of the current mode coupler of the present invention having a hinged enclosing lid in a closed position. FIG. 3 generally shows unitary casing 202 including an enclosing lid 302, a hinge 304, a wire core holder 306, a twisted pair cable 210, and stub connector 204. When enclosing lid 302 is in a position as shown in FIG. 3 (i.e., closed position), the magnetic core structure is formed as shown in FIG. 4. Wire core holder 306 sits within the data bus interface housing and is coupled to unitary casing 202 and functions to proximately position twisted pair cable 210 in an operable position (FIG. 3). The terms cable and twisted pair cable are used interchangeably herein.

Enclosing lid 302 is reasonably attached or coupled to unitary casing 202 via an apparatus, such as hinge 304. In one embodiment, enclosing lid 302 has a depression sufficient to operably house and couple a magnetic core, such as an I-core 402. When enclosing lid 302 is in a closed position, a fastener, such as, by way of example, a screw 310, fastens or attaches enclosing lid 302 to unitary casing 202. When screw 310 is in a tightened position, the outward face of I-core 402 is reasonably pressed against or makes contact with the E-faces of E-core 208, thus, creating a sufficient magnetic structure (FIG. 4) (i.e., an inductor). Those of skill in the art will realize that other fasteners may be suitable for fastening enclosing lid 302 to unitary casing 202.

In one embodiment, screw 310 is a spring-loaded fastener such as, by way of example, a quarter-turn fastener. To fasten enclosing lid 302 to unitary casing 202, the spring-loaded fastener is depressed, turned, for example, a quarter turn, and released. In other embodiments, screw 310 may be other fasteners, including or excluding a spring apparatus, which are fastened and unfastened by turning.

When a current is present in the twisted pair cable 210, mutual inductance allows for a current in the coils that is thereafter manipulated and transmitted to stub connector 204 by circuitry on circuit board 206.

The various layers of circuit board 206 include openings that allow the legs of E-cores 208 to fit through the openings. When enclosing lid 302 is in the closed position, the faces of I-core 402 contact the faces of E-cores 208. Circuit board 206 also includes coils that surround the center circuit board opening 212 (FIG. 2A).

Figure 5:
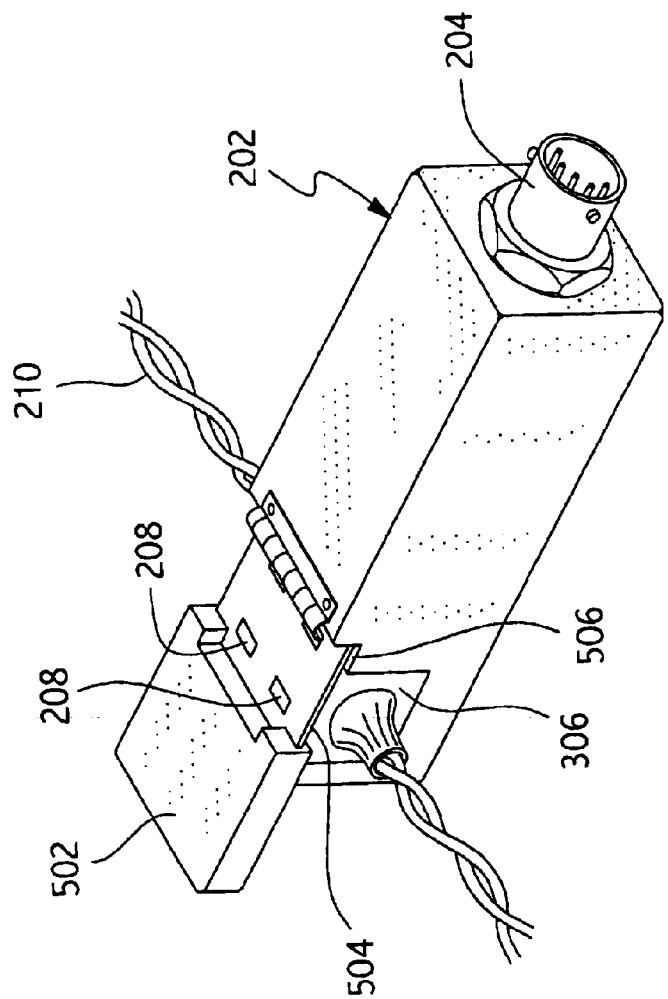
FIG. 5 is a perspective view of another embodiment of a current mode coupler depicting an enclosing lid attached to a unitary casing with a sliding mechanism.

FIG. 5 illustrates another embodiment of the current mode coupler of the present invention. An enclosing lid 502 is attached to unitary casing 202 with a sliding implement. The lower portion of enclosing lid 502 forms a shelf on both sides of enclosing lid 502. The shelf fits or engages a lip 504 protruding from wire core holder 306 and aligns enclosing lid 502, thus enabling enclosing lid 502 to slide atop wire core holder 306 into, for example, an open or closed position. Unitary casing 202 may include a cutout 506 suitable for receiving a protrusion or extension of the shelf on both sides of enclosing lid 502. Cutout 506 and the extension of the shelf operate to further align enclosing lid 502 and place enclosing lid 502 in a secure closed position. When enclosing lid 502 is in the closed position, the I-core is positioned such that the lower face of the two I-cores contained in or affixed to the underside or cavity of enclosing lid 502 sufficiently contact the E-faces of E-cores 208 to create magnetic structures.

Figure 6:
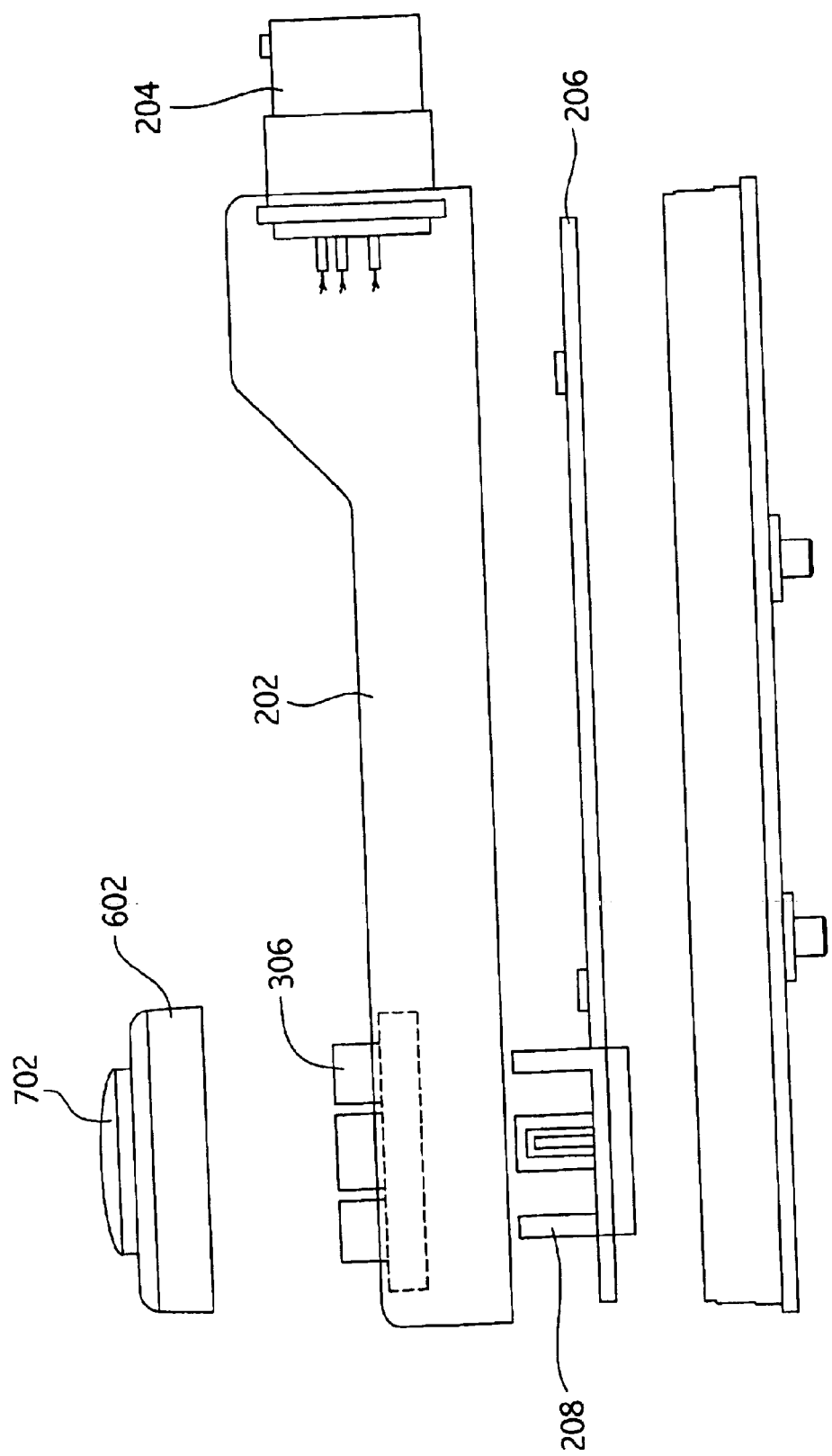
FIG. 6 is an exploded side view of still another embodiment of a current mode coupler depicting an enclosing lid attached to a unitary casing with a thumb screw.
Figure 7:
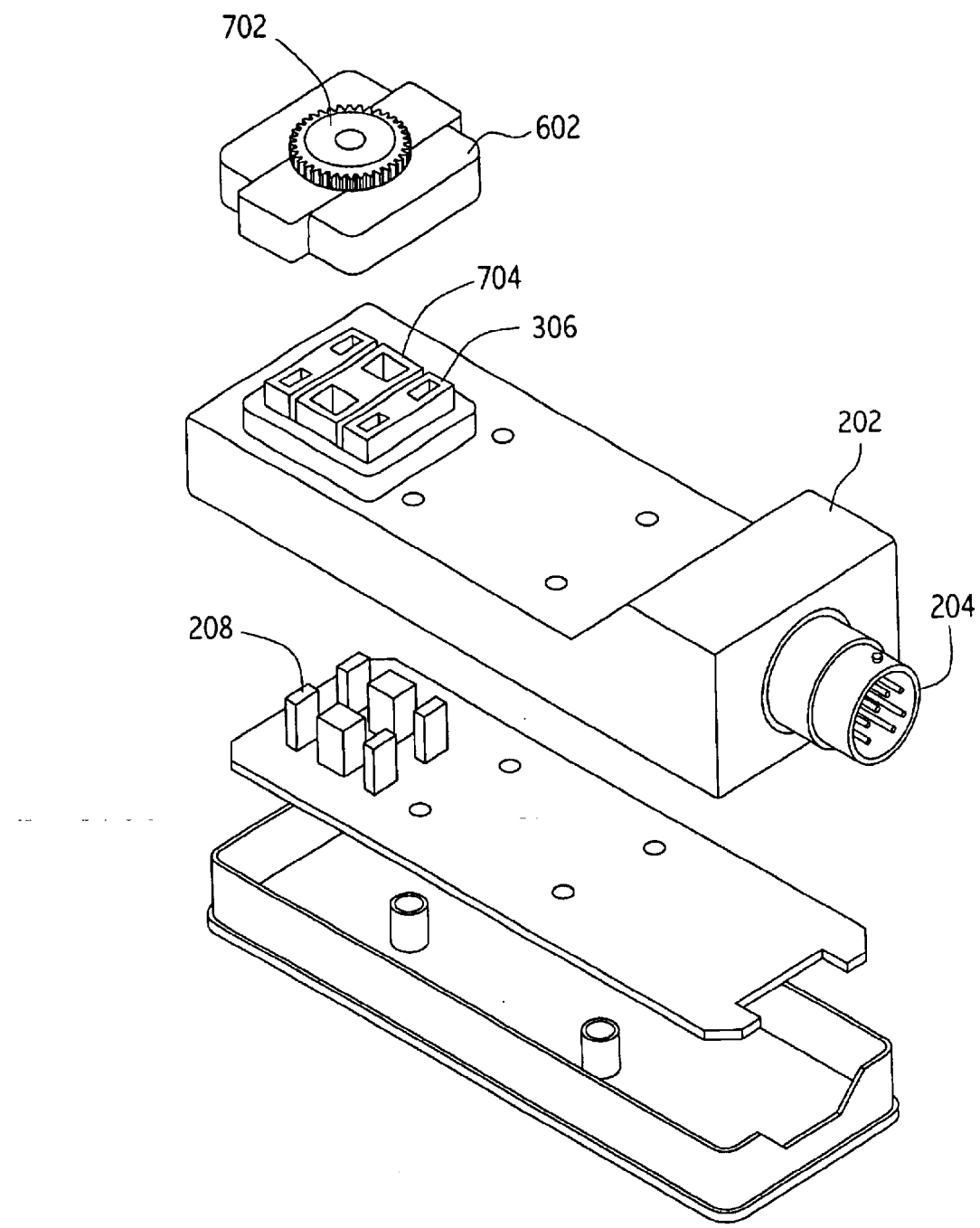
FIG. 7 is an exploded perspective view of still another embodiment of a current mode coupler having an enclosing lid attached to a unitary casing with a rotating mechanism.

Still another embodiment of the current mode coupler of the present invention is depicted in FIG. 6 and FIG. 7. FIG. 6 generally depicts a current mode coupler including stub connector 204, unitary casing 202, circuit board 206, E-core 208, wire core holder 306, and an enclosing lid 602. As depicted in the exploded perspective view of FIG. 7, a thumbscrew 702 is included in enclosing lid 602. A threaded hole 704 receives thumbscrew 702 and properly positions enclosing lid 602 on unitary casing 202. When thumbscrew 702 is tightened, the I-core located in enclosing lid 602 adequately contacts the faces of E-cores 208 to create a magnetic core.

Figure 8:
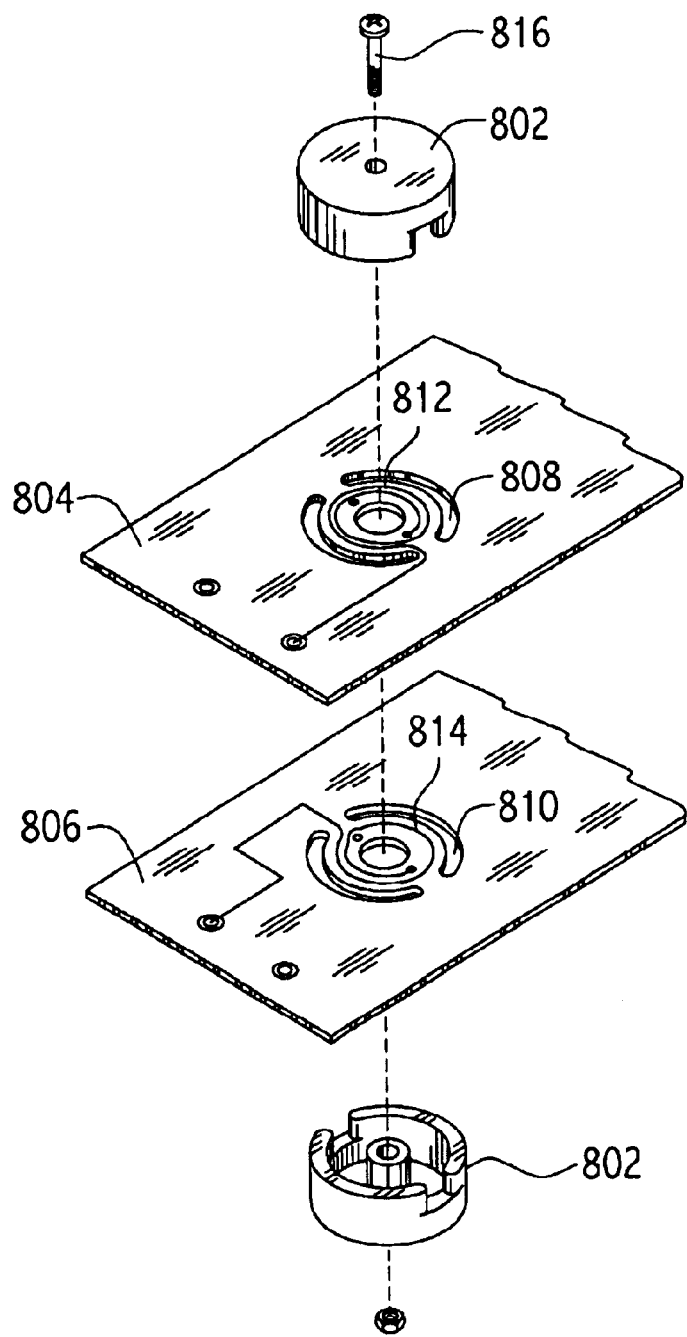
FIG. 8 illustrates one embodiment of an exploded perspective view of a circuit board depicting the positioning of a pot core transformer.

Various embodiments of the current mode coupler of the present invention can include a circuit board as depicted in FIG. 8. Circuit board 206 (FIG. 2A, FIG. 2B and FIG. 6) includes at least one pot core transformer 802 in a transmit stub interface 102 (FIG. 1) or a receive stub interface 106 (FIG. 1). Circuit board 206 includes a plurality of layers 804 (e.g., layer n) and 806 (e.g., layer n+1). For simplicity, only two layers of circuit board 206 are shown. Circuit board 206 can be made of multiple layers. Each layer includes pot core insertion openings (i.e., pot core insertion opening 808 in layer 804 and pot core insertion opening 810 in layer 806) shaped or configured to adequately receive the shape of pot core transformer 802. In addition, each layer in circuit board 206 includes circuit tracings 812 and 814 that circumscribe the center opening of pot core openings 808 and 810, respectively. When circuit board 206 is assembled, the upper and lower portions of pot core transformer 802 may be fastened with a nylon screw 816. When pot core transformers are employed in transmit stub interface 102 (FIG. 1), voltage doublets can be transmitted to stub connector 204 (FIG. 2). When the pot core transformers are employed in receive stub interface 106 (FIG. 1), voltage doublets can be received through stub connector 204 (FIG. 2).

Figure 9:
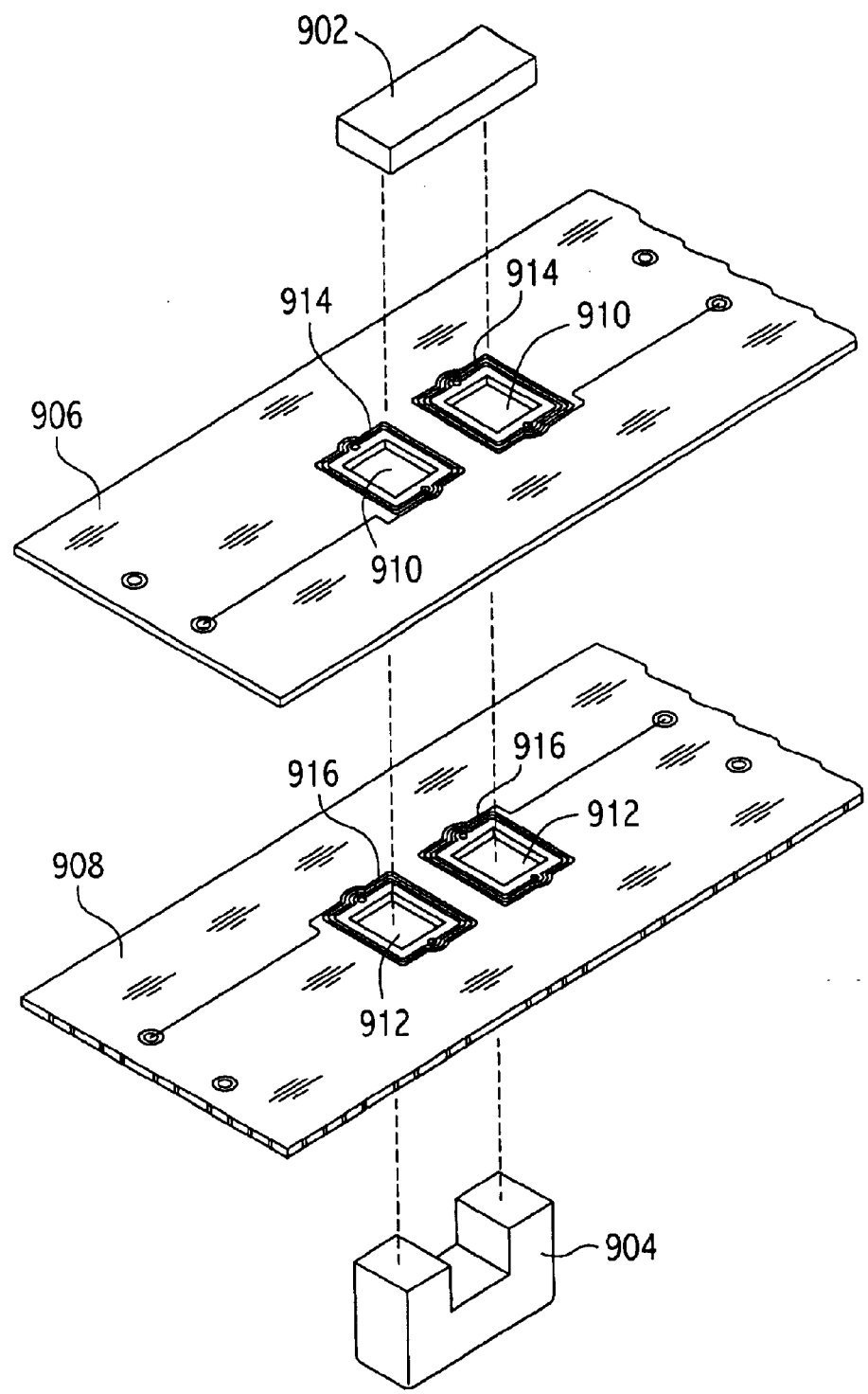
FIG. 9 illustrates one embodiment of an exploded perspective view of a circuit board depicting the positioning of a C/I transformer.

The embodiments of the current mode coupler of the present invention can alternatively include a circuit board as depicted in FIG. 9. Circuit board 206 (FIG. 2A, FIG. 2B and FIG. 6) includes at least one I-core 902 and at least one C-core 904 in transmit stub interface 102 (FIG. 1) or receive stub interface 106 (FIG. 1). Circuit board 206 includes a plurality of layers 906 (e.g., layer n) and 908 (e.g., layer n+1). For simplicity, only two layers of circuit board 206 are shown. Circuit board 206 can be made of multiple layers. Each layer includes C-core insertion openings (i.e., C-core insertion opening 910 in layer 906 and C-core insertion opening 912 in layer 908) shaped or configured to adequately receive a sufficient portion of C-core 904 (e.g., the upper protruding segments of C-core 904). In addition, each layer includes circuit tracings 914 and 916 that circumscribe C-core insertion openings 910 and 912, respectively. When the C-core transformers are employed in transmit stub interface 102 (FIG. 1), voltage doublets are received from the stub cable connector 204 (FIG. 2). When the C-core transformers are employed in receive stub interface 106 (FIG. 1), voltage doublets can be transmitted through stub connector 204 (FIG. 2).

Figure 10A:
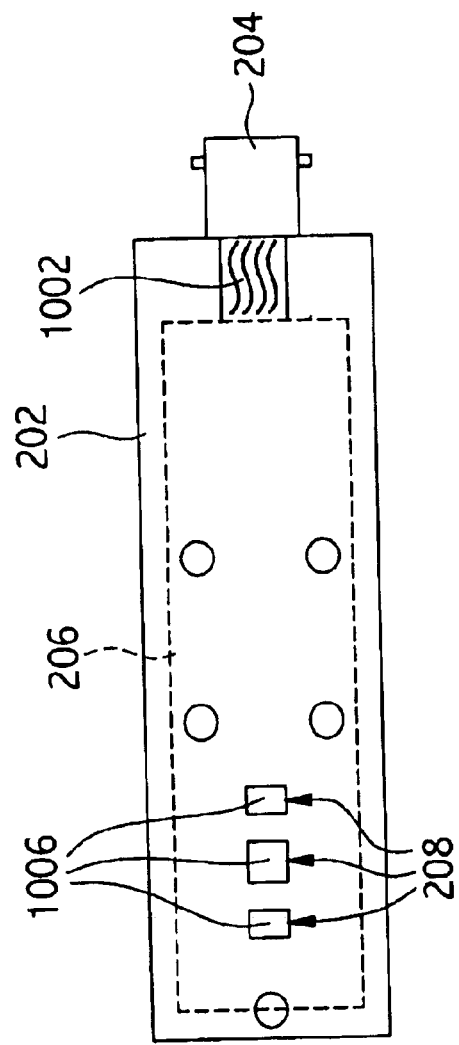
FIG. 10A is a plane view of yet another embodiment of a current mode coupler depicting a receive-only implementation.
Figure 10B:
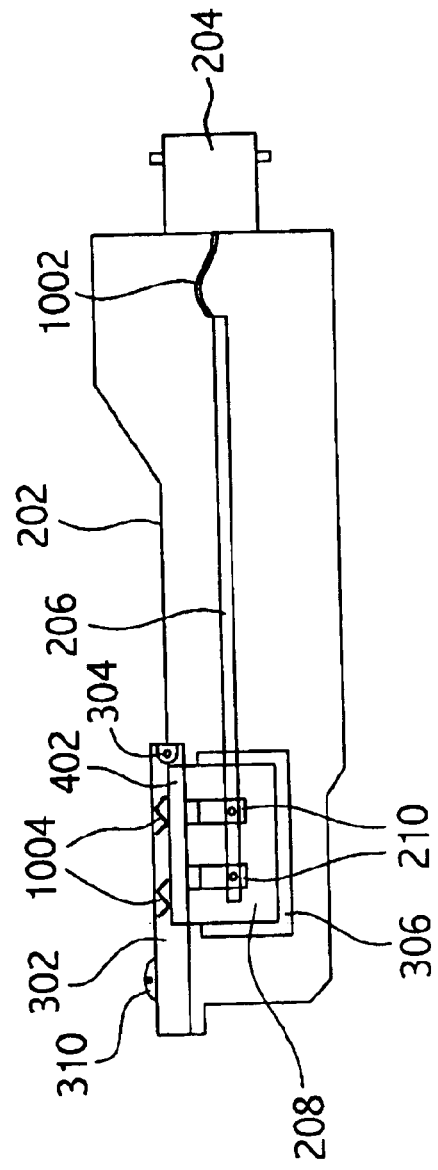
FIG. 10B is a side elevation view of yet another embodiment of a current mode coupler depicting a receive-only implementation.

Yet another embodiment of the current mode coupler of the present invention is depicted in FIG. 10A, FIG. 10B, FIG. 11, and FIG. 12. FIG. 10A, depicts one embodiment of a current mode coupler that functions as a receive-only coupler. The receive-only coupler includes unitary casing 202, a flex cable 1002, stub connector 204, circuit board 206, and a single ferrite core. FIG. 10B further depicts wire core holder 306 and enclosing lid 302 of the receive-only coupler. Enclosing lid 302 includes I-core 402 fixed within or affixed to an underside of enclosing lid 302 via an actuator suitable for exerting an elastic force, such as, by way of example, a spring mechanisms 1004. As depicted, spring mechanism 1004 is positioned opposite the contact face of the I-core 402. In particular, one or more spring mechanisms 1004 are operably positioned between the underside of enclosing lid 302 and I-core 402.

When enclosing lid 302 is in the closed position, the face of I-core 402 is urged against the faces of E-core legs 1006 (FIG. 10A). Circuit board 206 includes trace windings around the central leg of E-core 208, creating a transformer when current is present in cable 210. FIG. 10B depicts enclosing lid 302 attached to unitary casing 202 with hinged attachment 304. Enclosing lid 302 can also be attached to unitary casing 202 by a sliding mechanism such as that depicted in FIG. 5 or a thumbscrew attachment such as that depicted in FIG. 6 and FIG. 7.

Figure 11:
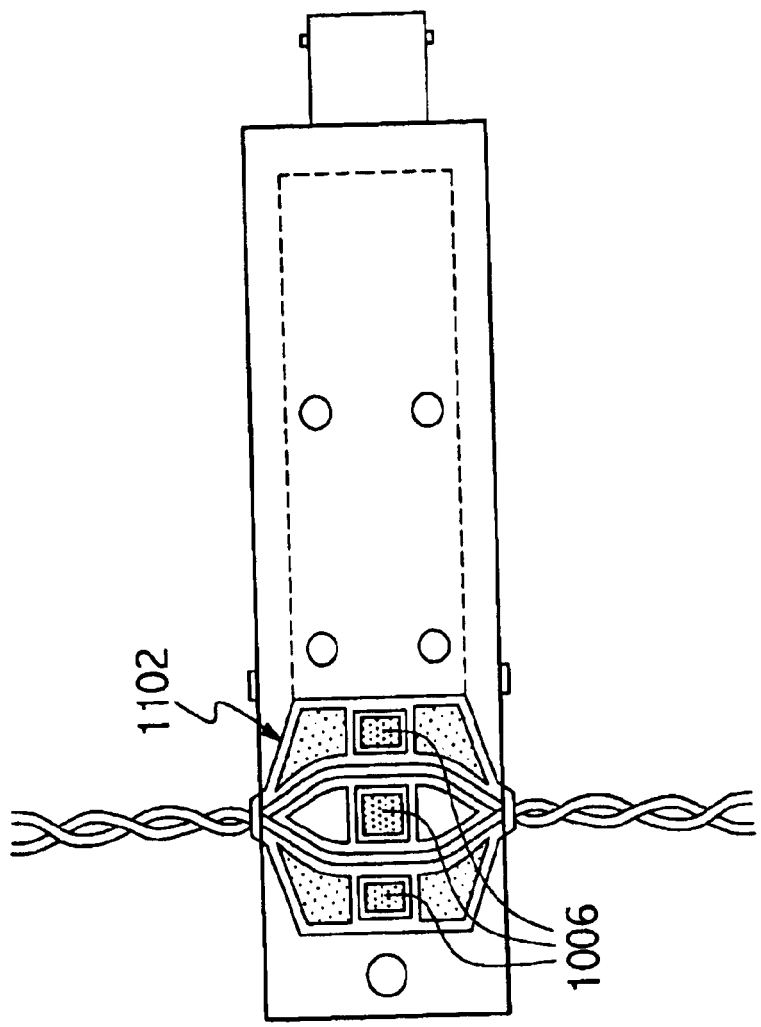
FIG. 11 is a plane view of yet another embodiment of a current mode coupler depicting a receive-only implementation and further depicting a wire core holder having only one E-core.

FIG. 11 depicts a plane view of yet another embodiment of the current mode coupler of the present invention. In particular, FIG. 11 illustrates a receive-only current mode coupler implementation, and further depicts a wire core holder having only one E-core. A wire core holder 1102 of the receive-only current mode coupler includes openings suitable for receiving E-core 208 (FIG. 11 and FIG. 10A) in a manner as to expose E-core faces 1006 (also referred herein as E-Core legs 1006) to the I-core face when enclosing lid 302 (FIG. 10B) is in the closed position. Contact of the I-core face with E-core faces 1006 creates a transformer when electrical current is on current mode data bus 118 (FIG. 1). Current mode data bus and data bus are used interchangeably herein.

Figure 12:
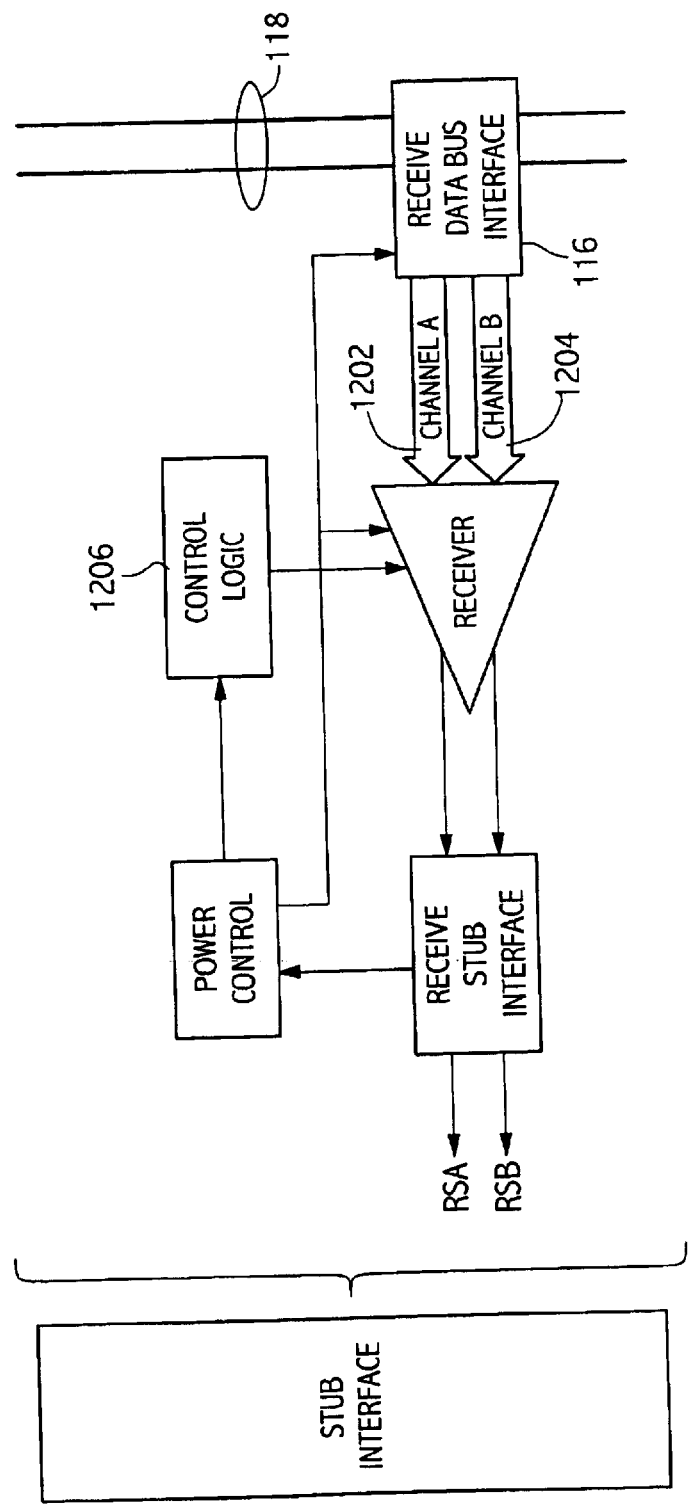
FIG. 12 is a block diagram illustrating the functionality of a receive-only current mode coupler, according to one embodiment of the present invention.

FIG. 12 is a block diagram that illustrates the functionality of one embodiment of the current mode coupler of the present invention. Receive data bus interface 116 is operable to sense current doublets on current mode data bus 118. Receive data bus interface 116 includes, but is not limited to, ferrite cores operable to function as transformers in conjunction with circuit board tracings. For redundancy, the data can be transmitted over either a Channel A 1202 or a Channel B 1204. For instance, data can be primarily received over Channel A 1202. However, if, for example, a control logic 1206 senses a delay in reception by Channel A 1202, Channel B 1204 can be activated. Control logic 1206 can be designed to power cycle the current mode coupler to allow Channel B 1204 to continue as the primary data receiver from current mode data bus 118. This embodiment does not include a transmit data bus interface. Other embodiments of the current mode coupler can include one or a different number of channels.

Figure 13:
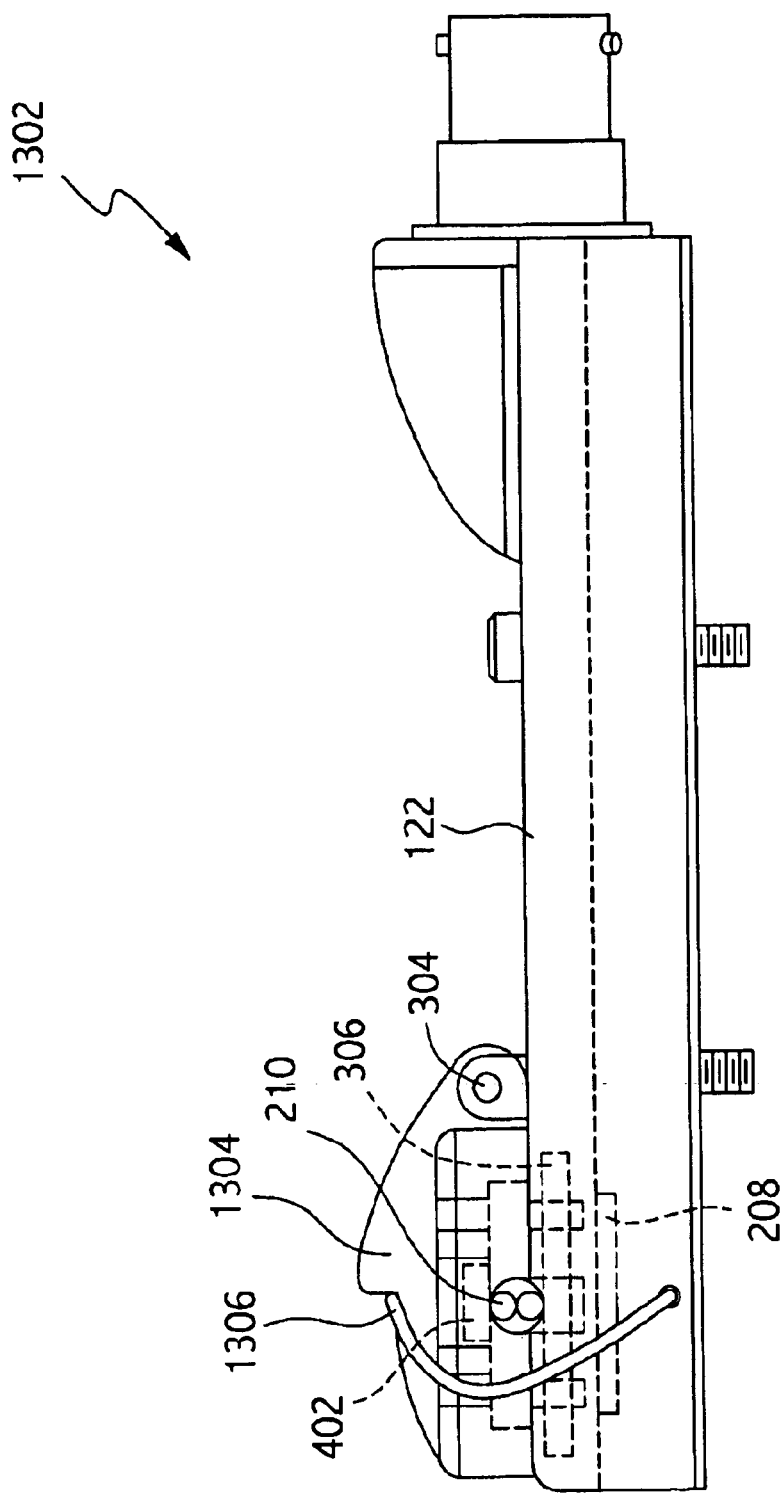
FIG. 13 is a side elevation view of one embodiment of a current mode coupler depicting a retention wire apparatus.

One embodiment of a current mode coupler of the present invention having a retention wire apparatus is described with reference to FIGS. 13–15. A side elevation view is depicted in FIG. 13 and the coupler as depicted is designated generally throughout by reference numeral 1302. Current mode coupler 1302 exhibits structures common to those described infra, including unitary casing 202, stub connector 204, E-core 208, I-core 402, and wire core holder 306.

Current mode coupler 1302 also includes an enclosing lid 1304 and a retention wire 1306. Enclosing lid 1304 is coupled or attached to unitary casing 202 with hinge 304. Within enclosing lid 1304, I-core 402 is positioned to contact the E-core faces of E-core 208 when enclosing lid 1304 is in a closed position. Retention wire 1306 operates to securely hold enclosing lid 1304 in a closed position.

Figure 14:
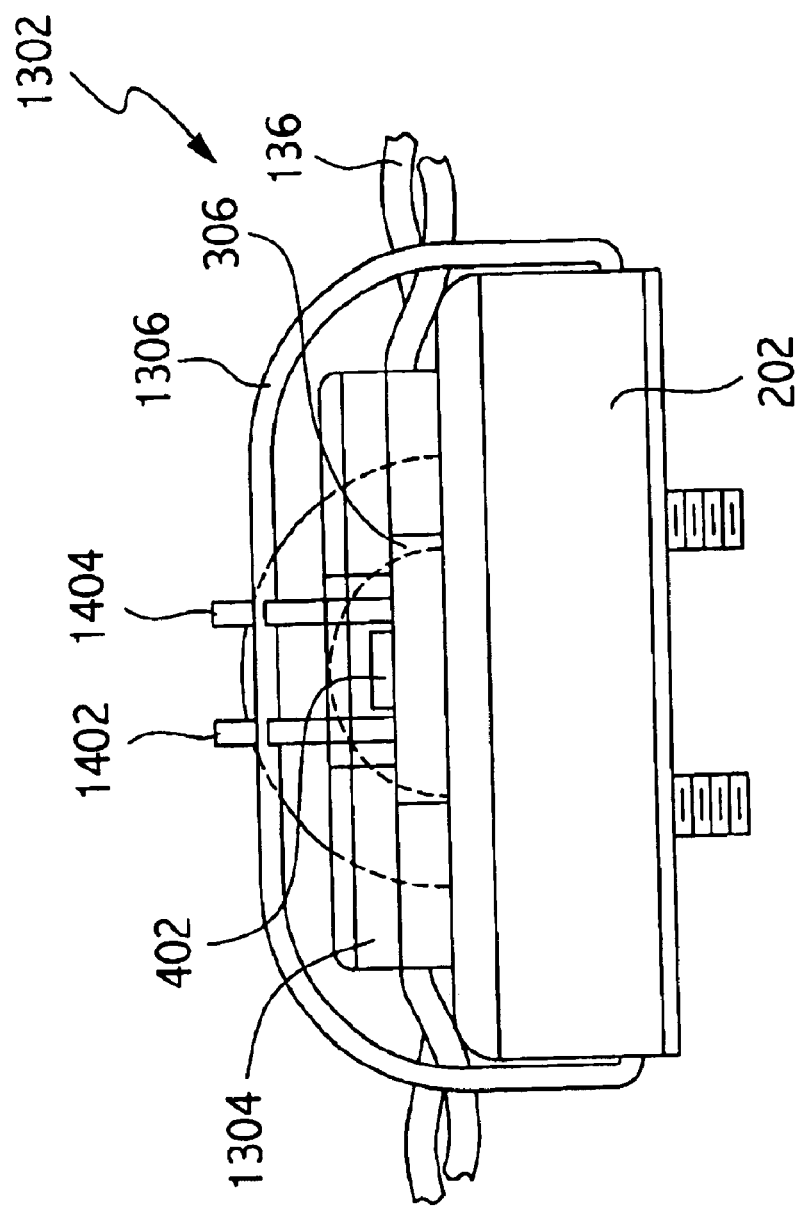
FIG. 14 is an end elevation view of one embodiment of a current mode coupler depicting a retention wire closing mechanism.

With reference to FIG. 14, protruding fingers 1402 and 1404 operate to receive and secure retention wire 1306. In one embodiment, protruding fingers 1402 and 1404 are protrusions of enclosing lid 1306. When retention wire 1306 is in a closed position and is attached to (e.g., received by) protruding fingers 1402 and 1404, enclosing lid 1304 is held securely in place. Retention wire 1306 causes a downward force on enclosing lid 1304, which ensures constant and adequate contact between the surface of I-core 402 and the faces of E-core 208 (FIG. 13). Other embodiments of current mode coupler 1302 may include a different number of protruding fingers, which are used to receive and secure retention wire 1306. Furthermore, the protruding fingers may be affixed to enclosing lid 1304, thus causing a protrusion of enclosing lid 1304.

Figure 15:
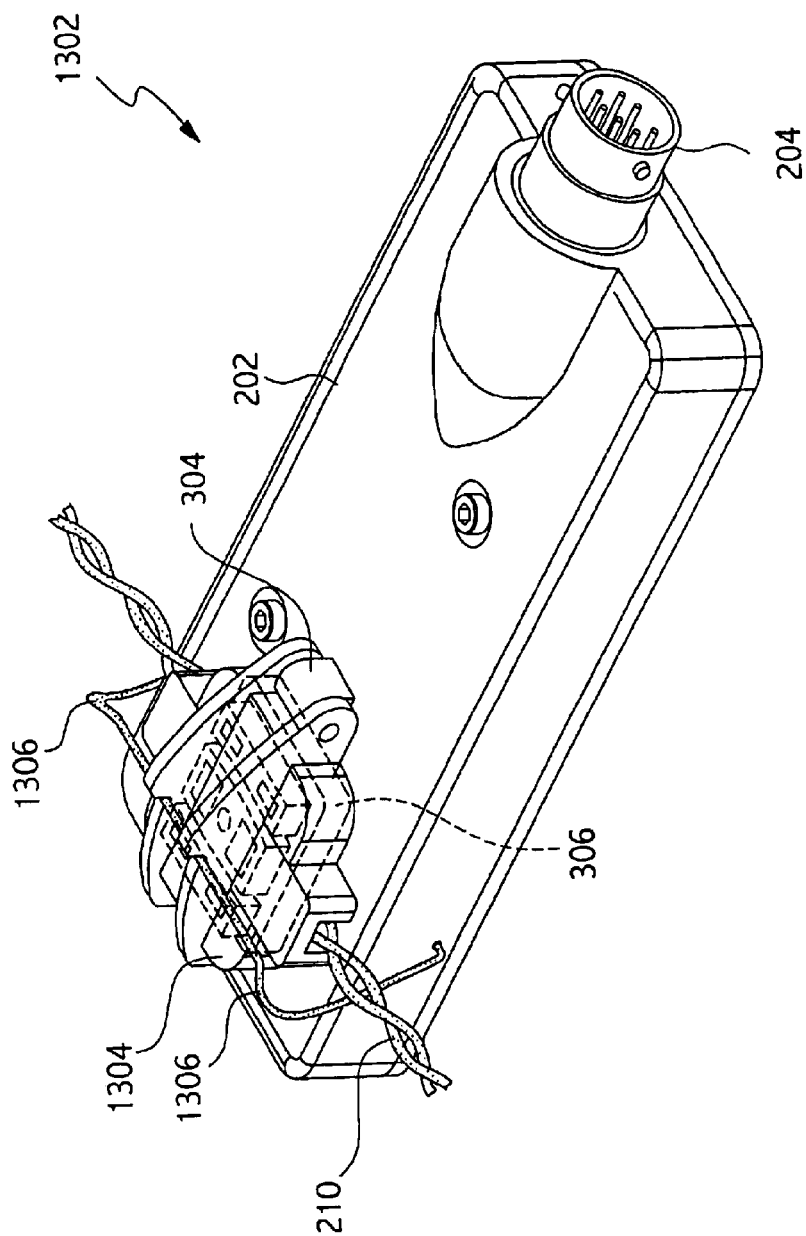
FIG. 15 is an isometric view of one embodiment of a current mode coupler depicting a retention wire and a closing lid.

FIG. 15 depicts an isometric view of current mode coupler 1302. As depicted, enclosing lid 1304, retention wire 1306, and hinge 304 work in conjunction to create magnetic core structures that enclose twisted pair cable 210. Retention wire 1306 is operable to hold the hinged enclosing lid 1304 in a position such that an I-core situated within enclosing lid 1304 makes contact with an E-core, for example, in wire core holder 306. Twisted pair 210 is positioned within wire core holder 306 such that data transmitted on cable 210 is sensed by the magnetic core structure formed by I-core 402 (not shown) and E-cores 208. Retention wire 1306 ensures that I-core 402 (not shown) is positioned and held in relationship to E-cores 208 such that the magnetic core structure is capable of sensing the magnetic field surrounding twisted pair cable 210.

Figure 16:
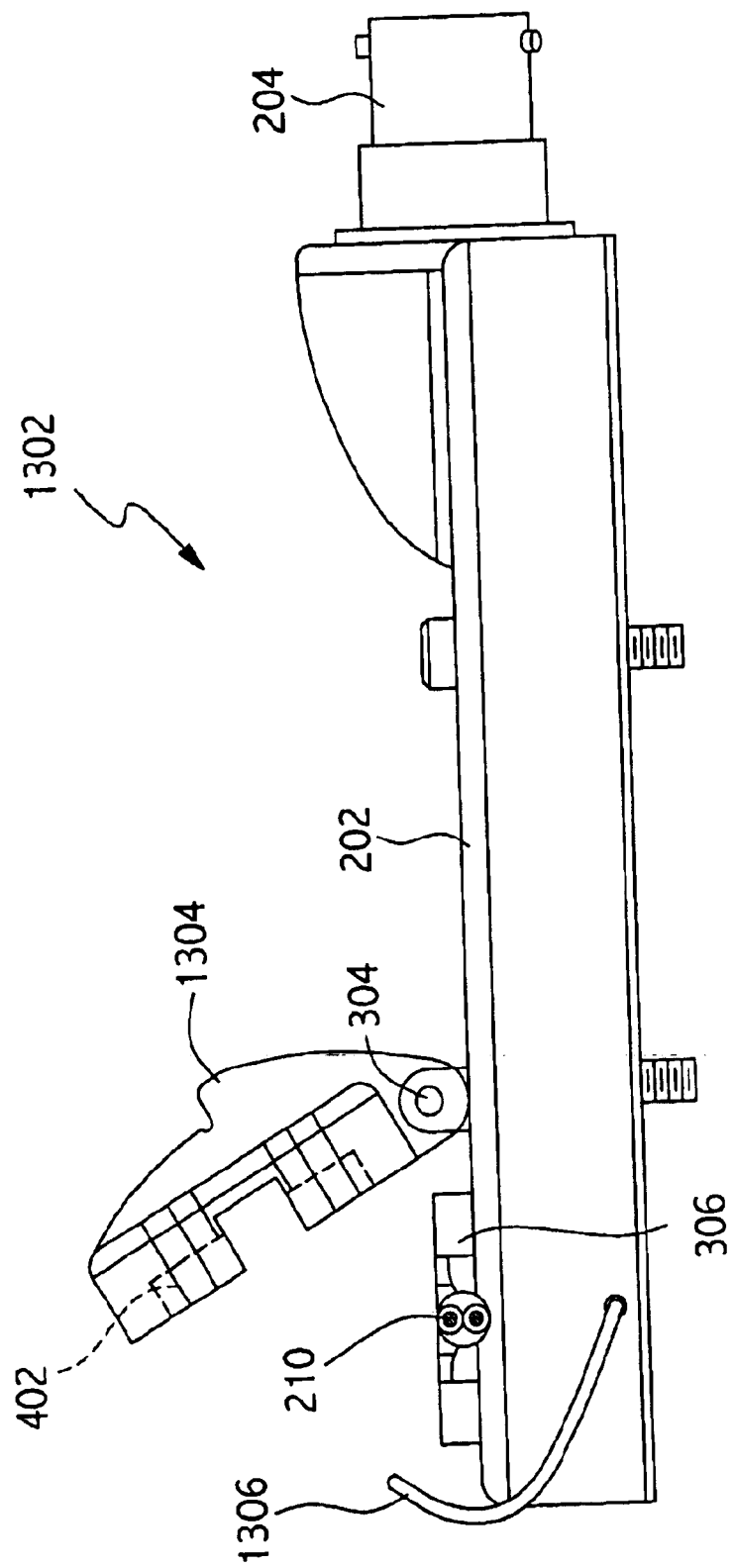
FIG. 16 is in the elevation view of a current mode coupler illustrating an enclosing lid in an open position and an unlatched retention wire, according to one embodiment of the present invention.

FIG. 16 is an elevation view of current mode coupler 1302 with retention wire 1306 positioned such that enclosing lid 1304 is in an open position. As shown, hinge 304 couples or attaches enclosing lid 1304 to unitary casing 202. While enclosing lid 1304 is in the open position, retention wire 1306 is in a position that allows opening of enclosing lid 1304.

Figure 17:
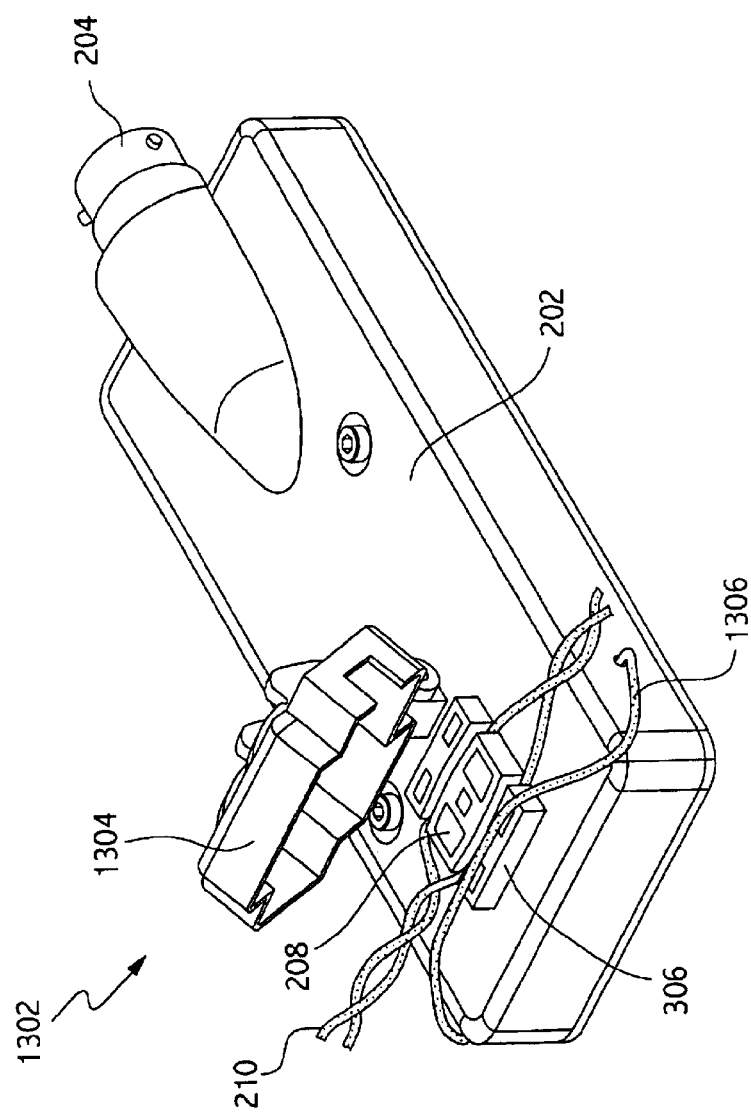
FIG. 17 is an isometric view of a current mode coupler illustrating the positioning of a twisted pair cable prior to closing an enclosing lid, according with one embodiment of the present invention.

FIG. 17 is an isometric view of current mode coupler 1302 with retention wire 1306 positioned such that enclosing lid 1304 is in an open position. As shown, where enclosing lid 1304 is in the open position, retention wire 1306 is rotated away from enclosing lid 1304. This allows enclosing lid 1304 to be placed in the open position using hinge 304 (FIG. 16). I-core 402 (not shown) is affixed in enclosing lid 1304. E-core 208 is positioned within wire core holder 306 such that, when enclosing lid 1304 is in the closed position as depicted, for example, in FIG. 13, I-core 402 (FIG. 16) contacts the E-core faces of E-cores 208. Once enclosing lid 1304 is in the closed position as depicted, for example, in FIG. 13, retention wire 1306 is moved or rotated toward and over enclosing lid 1304. Retention wire 1306 can be attached to enclosing lid 1304 as depicted in, for example, FIG. 13.

Figure 18:
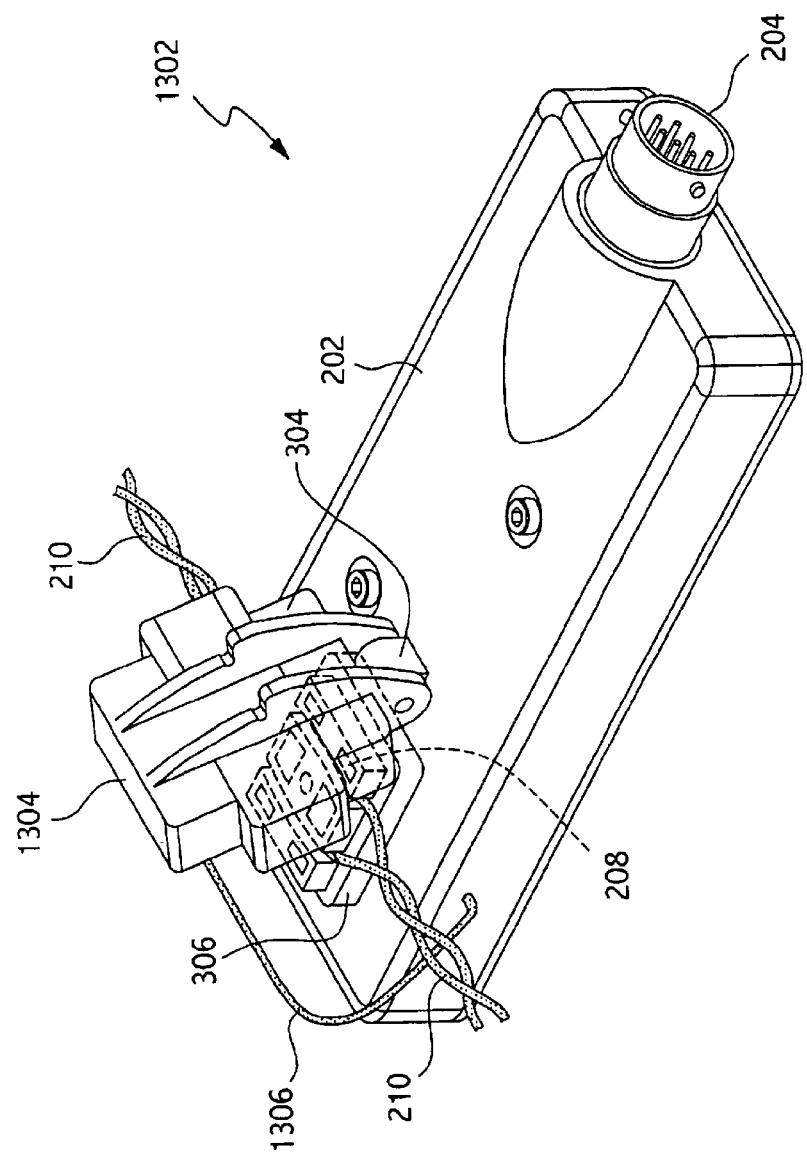
FIG. 18 is an isometric view of a current mode coupler having a retaining wire showing an enclosing lid in an open position, according to one embodiment of the present invention.
Figure 19:
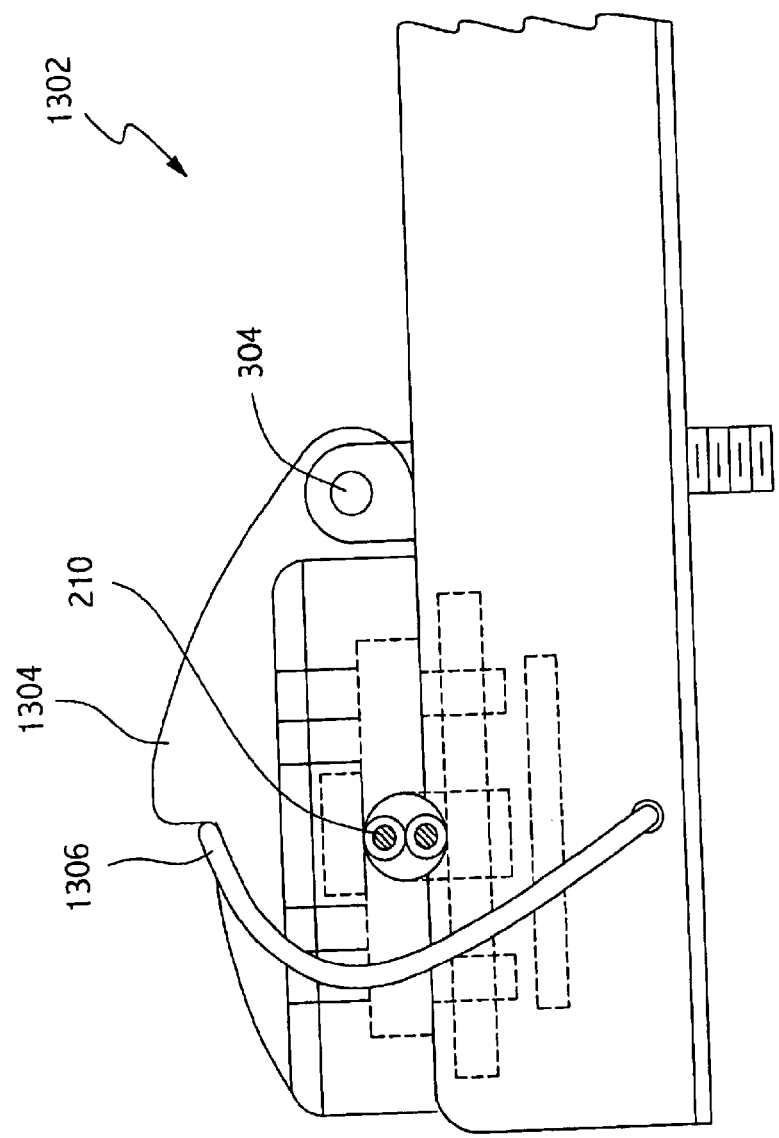
FIG. 19 is an elevation view of a current mode coupler illustrating an enclosing lid in an open position and an unlatched retention wire, according to one embodiment of the present invention.
Figure 20:
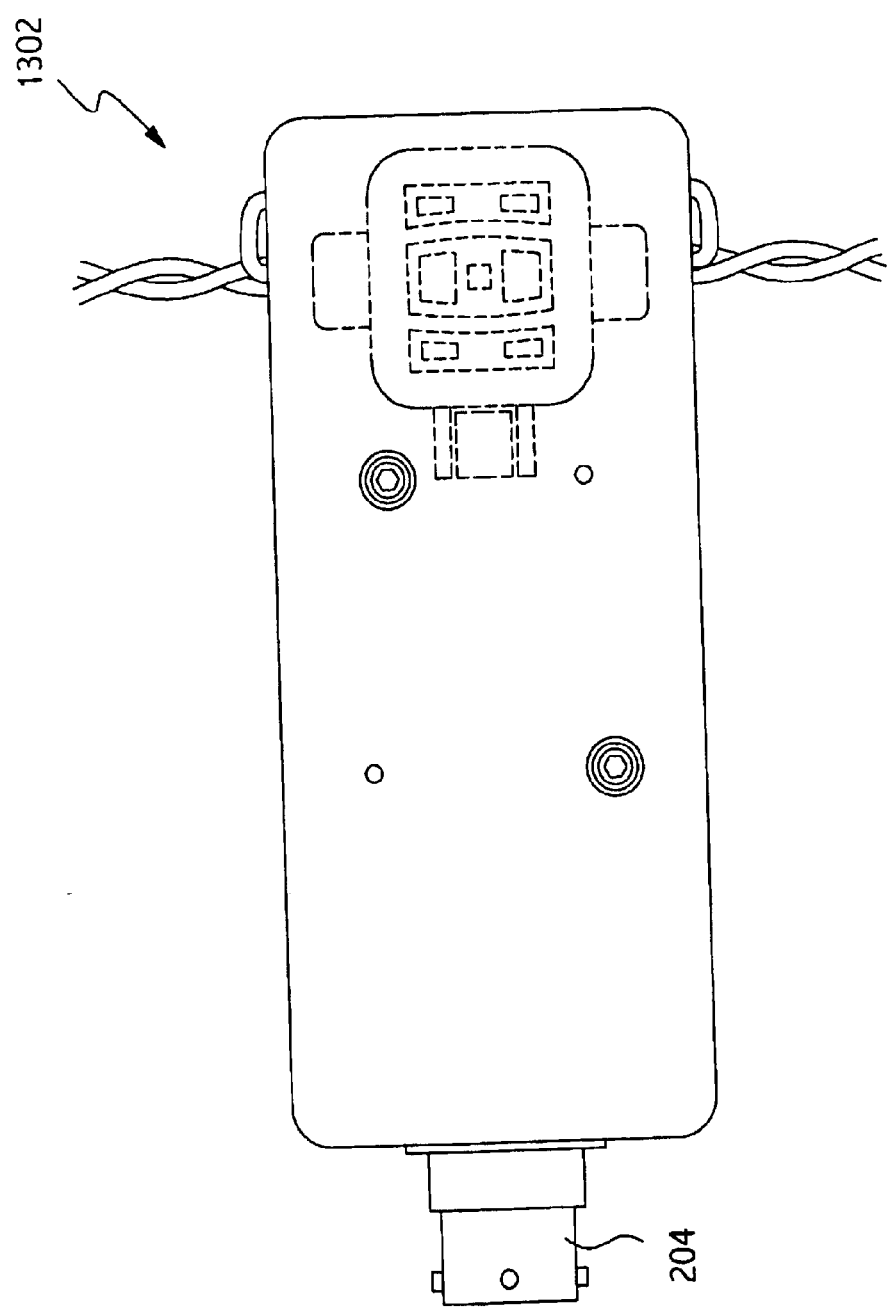
FIG. 20 illustrates a view of the underside of one embodiment of a current mode coupler.
Figure 21:
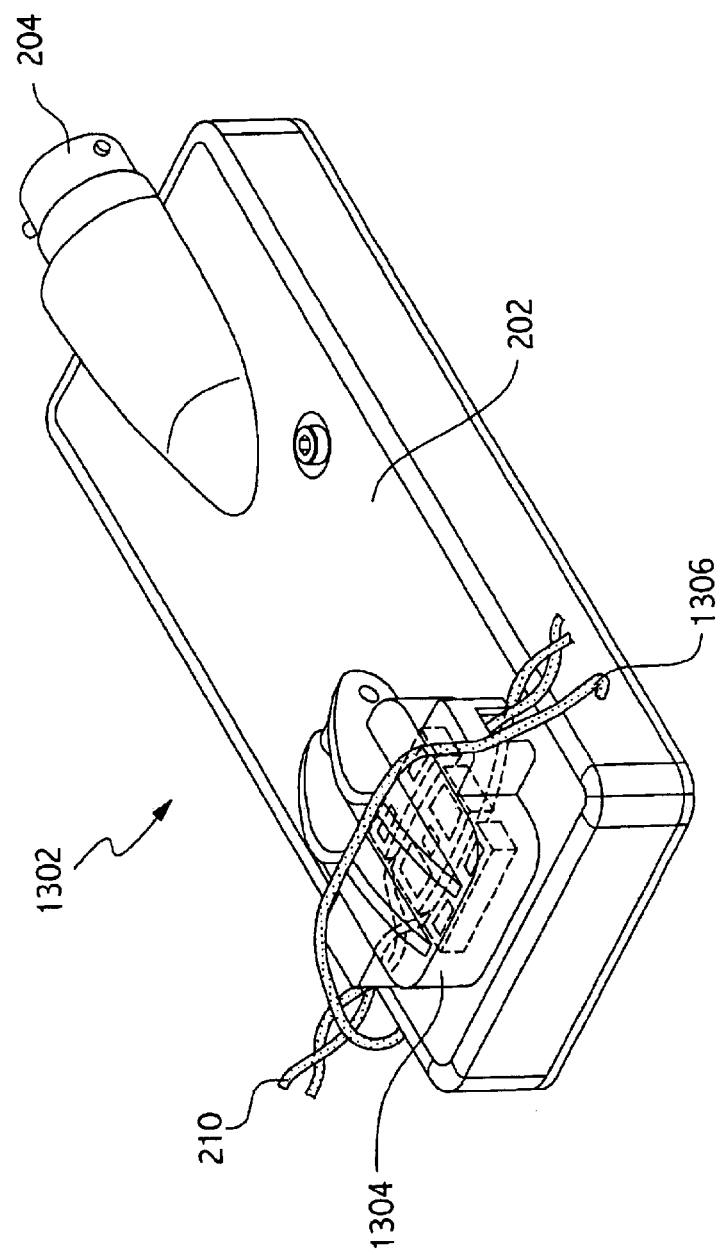
FIG. 21 is an isometric view of a current mode coupler illustrating the positioning of the twisted pair cable prior to closing an enclosing lid, according to one embodiment of the present invention.
Figure 22:
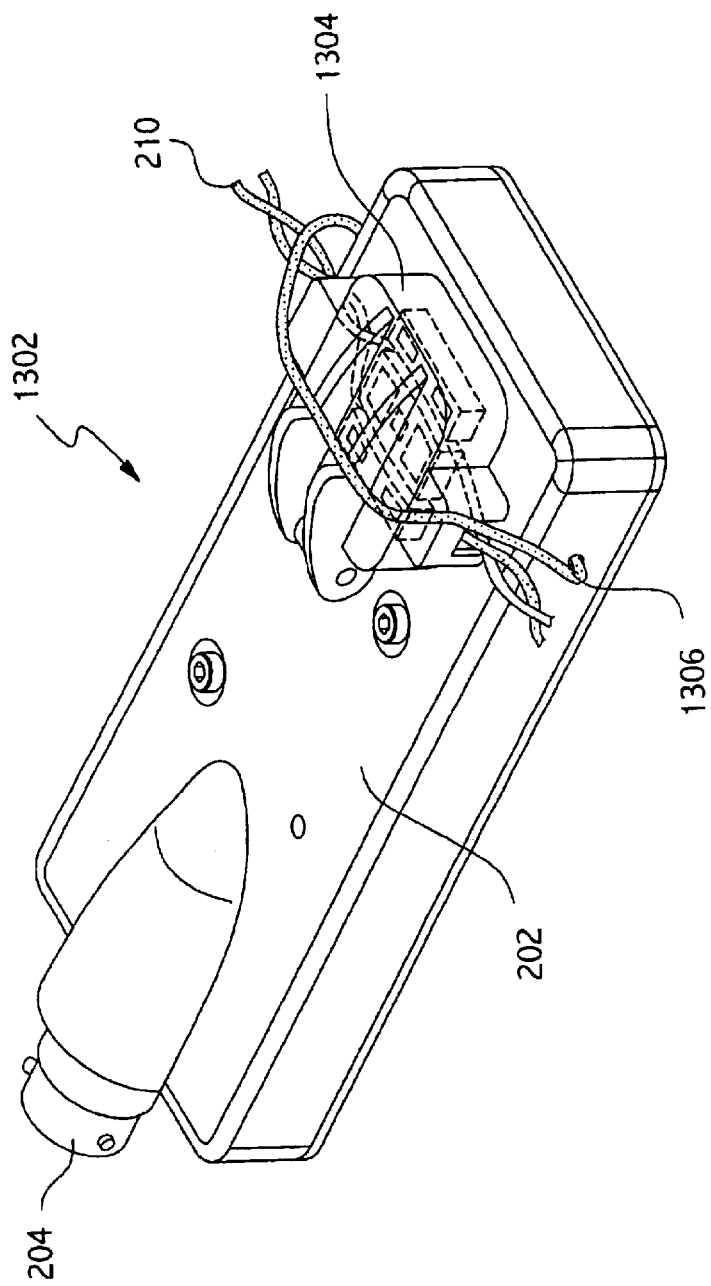
FIG. 22 is an isometric view of a current mode coupler having a retaining wire showing an enclosing lid in an open position, according to one embodiment of the present invention.
Figure 23:
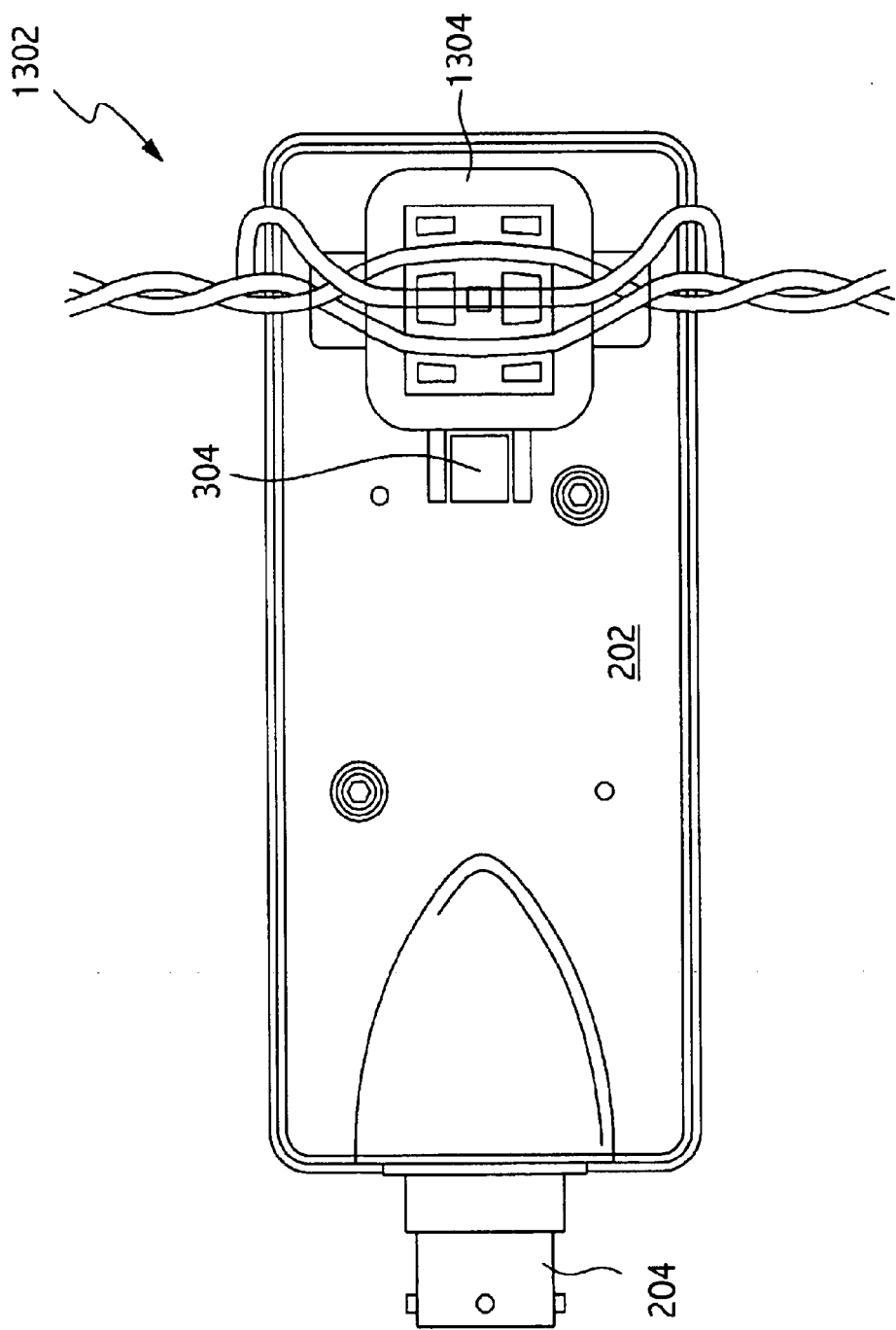
FIG. 23 is a plane view of a current mode coupler having an enclosing lid held by a retention wire, according to one embodiment of the present invention.

FIG. 18 is another isometric view of current mode coupler 1302 with retention wire positioned such that enclosing lid 1304 is in an open position. In particular, FIG. 18 shows hinge 304 and its relationship to enclosing lid 1304 when the enclosing lid 1304 is in an open position. FIGS. 19–23 depict various additional views of current mode coupler 1302 having enclosing lid 1304 that is held in place by retention wire 1306.

Other embodiments of the current mode coupler can include a depression, for example, atop the enclosing lid. The depression functions to receive and hold a retention wire, such as, retention wire 1306, securely while the retention wire is rotated and positioned atop the enclosing lid and into the depression. A forward portion of the enclosing lid may be dome or elliptical-shaped to enable the retention wire to be rotated atop the enclosing lid an into the depression. Those of skill in the art will realize that the retention wire needs to be a size suitable to ensure a snug and secure fit while positioned in the depression.

Generally, the current mode coupler of the present invention includes a stub connector that connects via, for example, a circuit board to a magnetic structure. The magnetic structure interfaces to a current mode data bus. Thus, the current mode coupler is capable of receiving data from and transmitting data to the data bus. In the current mode coupler, current doublets are transformed and transmitted as voltage doublets to the stub connector to be used by a controller coupled to the stub connector. Various embodiments of the present invention employ an enclosing lid that contains an I-core, which is coupled to a unitary casing that contains an E-core. The magnetic structure is created when the I-core in the enclosing lid and the E-core in the unitary casing make contact. The enclosing lid of the current mode coupler can be attached to the unitary casing with devices, such as, by way of example, a hinge, a sliding implement, or a rotating connector.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

What is claimed is:

1. A non-invasive current mode coupler comprising:
   a unitary casing having a data bus interface housing, the unitary casing having a connector;
   a first magnetic core and a second magnetic core, the first and second magnetic core operable to function as an inductor when in proximate contact;
   a wire core holder operable to fit within the data bus interface housing, the wire core holder operable to secure the first magnetic core; the wire core holder further operable to couple and inductively interface a data bus;
   an enclosing lid coupled to the unitary casing, the enclosing lid operable to house the second magnetic core; and
   a communication component affixed within the unitary casing, the communication component coupled to the connector and the first magnetic core, the communication component operable to facilitate communication between the connector and an inductively coupled data bus.

2. The current mode coupler of claim 1, wherein the first magnetic core is an E-core and the second magnetic core is an I-core.

3. The current mode coupler of claim 1, wherein the data bus is a twisted pair cable.

4. The current mode coupler of claim 1, wherein the enclosing lid is coupled to the unitary casing via a hinge.

5. The current mode coupler of claim 1, wherein the enclosing lid is coupled to the unitary casing via a sliding implement.

6. The current mode coupler of claim 5 further comprising:
   a cutout in the unitary casing; and
   a protrusion on the enclosing lid, the protrusion operable to be received by the cutout when the enclosing lid is slid in a closed position.

7. The current mode coupler of claim 1 further comprising an actuator operable to exert an elastic force, the actuator positioned between an underside of the enclosing lid and the housed second magnetic core.

8. The current mode coupler of claim 7, wherein the actuator is a spring.

9. The current mode coupler of claim 1 further comprising a fastener operable to secure the enclosing lid to the unitary casing in a closed position.

10. The current mode coupler of claim 9, wherein the fastener is a spring-loaded fastener.

11. The current mode coupler of claim 9, wherein the fastener is a thumbscrew.

12. The current mode coupler of claim 9, wherein the fastener is a retention wire, the retention wire operable to rotate above the enclosing lid.

13. The current mode coupler of claim 12, wherein the enclosing lid includes at least one protruding finger operable to receive the retention wire.

14. The current mode coupler of claim 12, wherein the enclosing lid includes a depression proximately atop the enclosing lid, the depression operable to receive the retention wire.

15. The current mode coupler of claim 1, wherein the communication component comprises a circuit board.

16. A non-invasive current mode coupler comprising:
   a unitary casing having a data bus interface housing and a connector;
   a communication component coupled to the connector;
   an E-core coupled to the communication component and situated in the data bus interface housing of the unitary casing; and
   an I-core affixed to an enclosing lid, the enclosing lid coupled to the unitary casing and operable to be positioned to sufficiently contact the I-core and the E-core.

17. A receive-only non-invasive current mode couplet comprising:
   a unitary casing having a data bus interface housing and a connector;
   a first magnetic core and a second magnetic core, the first and second magnetic core operable to function as an inductor when in proximate contact;
   an enclosing lid coupled to the unitary casing, the enclosing lid operable to house the second magnetic core; and
   a communication component affixed to the unitary casing and coupled to the connector and the first magnetic core, the communication component operable to receive data from the connector but not operable to transmit data to the connector.

* * * * *